United States Patent
Shiah et al.

(10) Patent No.: US 8,653,855 B2
(45) Date of Patent: Feb. 18, 2014

(54) INPUT BUFFER SYSTEM WITH A DUAL-INPUT BUFFER SWITCHING FUNCTION AND METHOD THEREOF

(75) Inventors: Chun Shiah, Hsinchu (TW); Sen-Fu Hong, Tainan (TW); Chia-Ming Chen, New Taipei (TW)

(73) Assignee: Etron Technology, Inc., Hsinchu (TW)

( * ) Notice: Subject to any disclaimer, the term of this patent is extended or adjusted under 35 U.S.C. 154(b) by 106 days.

(21) Appl. No.: 13/105,891

(22) Filed: May 11, 2011

(65) Prior Publication Data

US 2012/0169371 A1    Jul. 5, 2012

(30) Foreign Application Priority Data

Jan. 3, 2011  (TW) .............................. 100100044 A

(51) Int. Cl.
*H03K 19/094*   (2006.01)
(52) U.S. Cl.
USPC .................. 326/86; 326/82; 326/83; 326/104; 326/52
(58) Field of Classification Search
USPC ............. 326/52–55, 104–108, 81, 83, 86–87, 326/114–115
See application file for complete search history.

(56) References Cited

U.S. PATENT DOCUMENTS

| | | | |
|---|---|---|---|
| 5,673,282 A * | 9/1997 | Wurst | 372/38.09 |
| 6,703,866 B1 * | 3/2004 | Arimilli et al. | 326/86 |
| 7,362,134 B2 * | 4/2008 | Bajkowski et al. | 326/46 |
| 2002/0180516 A1 * | 12/2002 | Harrison | 327/563 |
| 2004/0066213 A1 * | 4/2004 | Kwak et al. | 326/52 |
| 2008/0294855 A1 | 11/2008 | Chen | |
| 2008/0315920 A1 * | 12/2008 | Hung et al. | 326/105 |
| 2009/0295429 A1 * | 12/2009 | Hori | 326/80 |

* cited by examiner

*Primary Examiner* — Shawki Ismail
*Assistant Examiner* — Christopher Lo
(74) *Attorney, Agent, or Firm* — Winston Hsu; Scott Margo

(57) ABSTRACT

An input buffer system with a dual-input buffer switching function includes a first input buffer, a second input buffer, and a multiplexer. The first input buffer is used for outputting a first signal when an input signal is at a logic-high voltage, and the first input buffer is turned off when the input signal is at a logic-low voltage. The second input buffer is used for outputting a second signal when the input signal is at the logic-low voltage. The multiplexer is coupled to the first input buffer and the second input buffer for outputting the first signal or the second signal according to a self refresh signal.

9 Claims, 9 Drawing Sheets

INPUT BUFFER SYSTEM WITH A DUAL-INPUT BUFFER SWITCHING FUNCTION AND METHOD THEREOF

BACKGROUND OF THE INVENTION

1. Field of the Invention

The present invention is related to an input buffer system and a method of switching a dual-input buffer, and particularly to an input buffer system with a dual-input buffer switching function and method thereof.

2. Description of the Prior Art

Please refer to FIG. 1. FIG. 1 is a diagram illustrating an input buffer 100 according to the prior art. The input buffer 100 includes a NOR gate 102 and an inverter 104. The NOR gate 102 has a first input terminal for receiving an input signal XCKE, a second input terminal for receiving an enable signal ENB, and an output terminal. The inverter 104 has an input terminal coupled to the output terminal of the NOR gate 102, and an output terminal for outputting a signal CKEI. When the enable signal ENB is at a logic-high voltage, a phase of the signal CKEI outputted by the inverter 104 is the same as a phase of the input signal XCKE. That is to say, when the input signal XCKE is at the logic-high voltage, the signal CKEI is also at the logic-high voltage, and vice versa. In addition, the input buffer 100 only consumes power during the signal CKEI being changed from the logic-high voltage to a logic-low voltage, or from the logic-low voltage to the logic-high voltage.

However, time required by the signal CKEI of the input buffer 100 being changed from the logic-high voltage to the logic-low voltage is different from time required by the signal CKEI of the input buffer 100 being changed from the logic-low voltage to the logic-high voltage. Therefore, if the signal CKEI is applied to a self refresh function of a synchronous dynamic random access memory (SDRAM), setup time of the synchronous dynamic random access memory may be incorrect when the synchronous dynamic random access memory enters the self refresh function.

SUMMARY OF THE INVENTION

An embodiment provides an input buffer system with a dual-input buffer switching function. The input buffer system includes a first input buffer, a second input buffer, and a multiplexer. The first input buffer is used for outputting a first signal when an input signal is at a logic-high voltage and. The first input buffer is turned off when the input signal is at a logic-low voltage. The second input buffer is used for outputting a second signal when the input signal is at the logic-low voltage. The second input buffer is turned off when the input signal is at a logic-high voltage. The multiplexer is coupled to the first input buffer and the second input buffer for outputting the first signal or the second signal according to a self-refresh signal.

Another embodiment provides an input buffer system with a dual-input buffer switching function. The method includes inputting a logic-high voltage to a first input buffer and a second input buffer for the first input buffer to output a first signal; inputting a logic-low voltage to the first input buffer and the second input buffer to turn off the first input buffer and for the second input buffer to output a second signal; a multiplexer outputting the first signal according to a self-refresh signal when the logic-high voltage is inputted to the first input buffer and the second input buffer, and outputting the second signal when the logic-low voltage is inputted to the first input buffer and the second input buffer.

The present invention provides an input buffer system with a dual-input buffer switching function and a method thereof. The input buffer system and the method thereof utilize a first input buffer to output a first signal with a logic-high voltage when an input signal is at the logic-high voltage, and a second input buffer to output a second signal with a logic-low voltage when the input signal is at the logic-low voltage. Then, a multiplexer outputs the first signal when the input signal is at the logic-high voltage, and outputs the second signal when the input signal is at the logic-low voltage. Therefore, time required by an output signal of the input buffer system being changed from the logic-high voltage to the logic-low voltage is the same as time required by the output signal being changed from the logic-low voltage to the logic-high voltage. Thus, when the input buffer system is applied to a self refresh function of a synchronous dynamic random access memory (SDRAM), setup time of the synchronous dynamic random access memory is correct after the synchronous dynamic random access memory enters the self refresh function.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
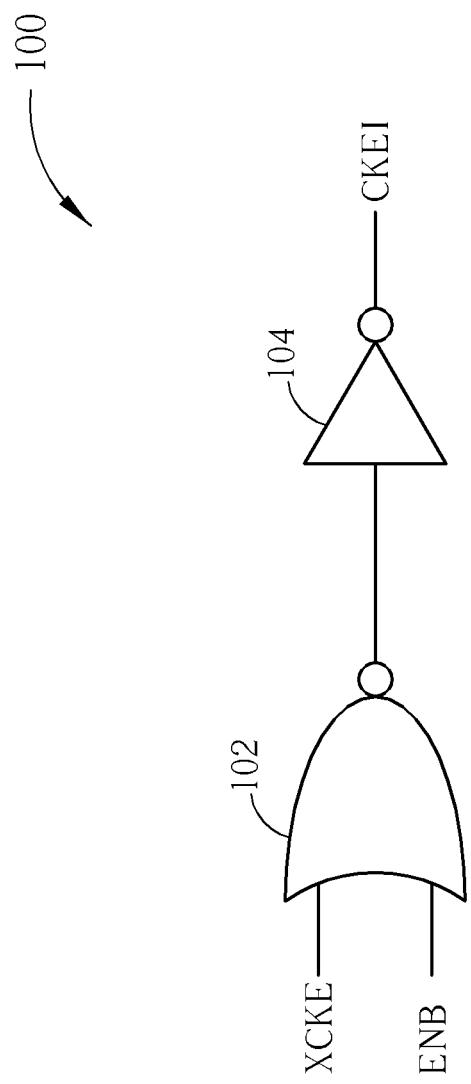
FIG. 1 is a diagram illustrating an input buffer according to the prior art.
Figure 2:
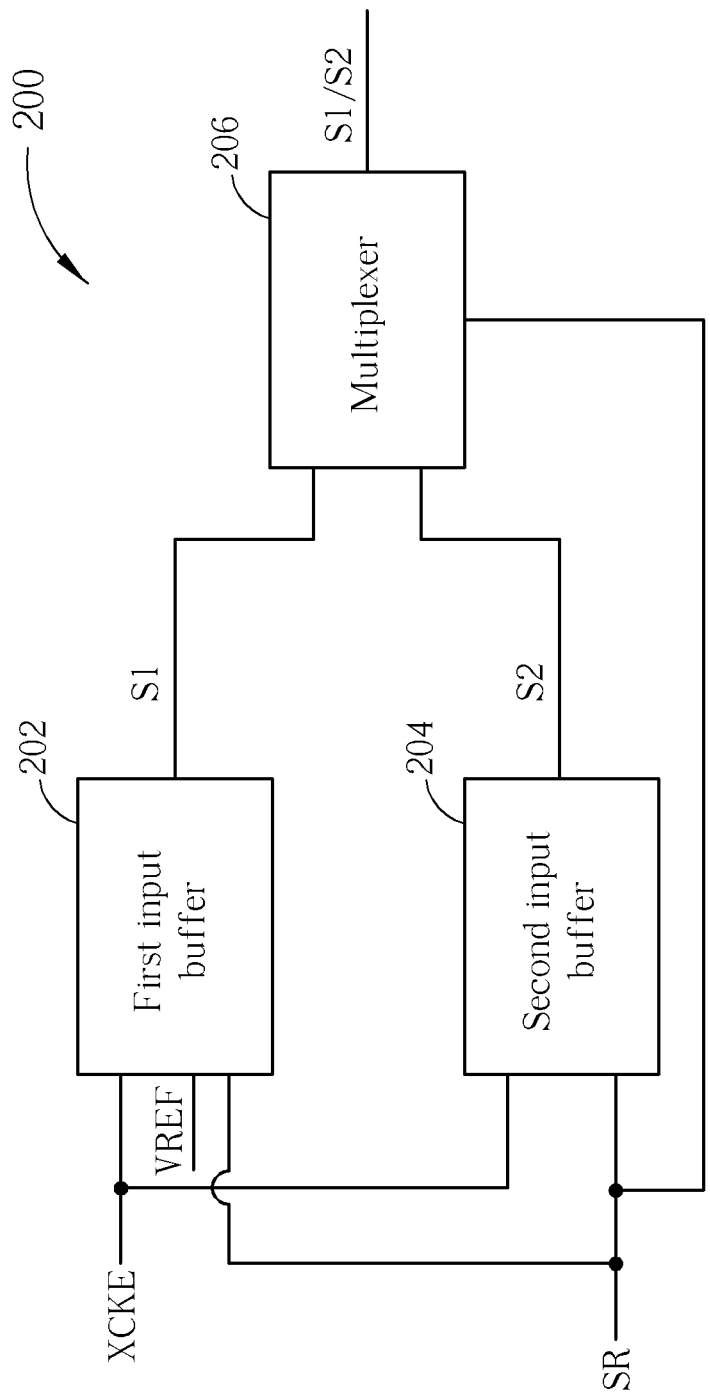
FIG. 2 is a diagram illustrating an input buffer system with a dual-input buffer switching function according to an embodiment.

Please refer to FIG. 2. FIG. 2 is a diagram illustrating an input buffer system 200 with a dual-input buffer switching function according to an embodiment. The input buffer system 200 includes a first input buffer 202, a second input buffer 204, and a multiplexer 206. The first input buffer 202 has a first input terminal for receiving an input signal XCKE, a second input terminal for receiving a reference VREF, a third input terminal for receiving a self refresh signal SR, and an output terminal for outputting a first signal S1. The first input buffer 202 is a comparator. But, the present invention is not limited to the first input buffer 202 being a comparator. When the input signal XCKE is at a logic-high voltage (meanwhile, the self refresh signal SR is at a logic-low voltage), the first input buffer 202 outputs the first signal S1 after the first input buffer 202 compares the input signal XCKE with the reference VREF. In addition, when the self refresh signal SR is at the logic-high voltage (that is, the input signal XCKE is at the logic-low voltage), the first input buffer 202 is turned off. But, the present invention is not limited to a phase of the input signal XCKE being opposite to a phase of the self refresh signal SR. That is to say, the phase of the input signal XCKE is the same as the phase of the self refresh signal SR. If the phase of the input signal XCKE is the same as the phase of the self refresh signal SR, the first input buffer 202 is turned off when the self refresh signal SR is at the logic-low voltage (that is, the input signal XCKE is at the logic-low voltage).

The second input buffer 204 has a first input terminal for receiving the input signal XCKE, a second input terminal for receiving the self refresh signal SR, and an output terminal for outputting a second signal S2. The second input buffer 204 is a NAND gate. But, the present invention is not limited to the second input buffer 204 being a NAND gate. When the input signal XCKE is at the logic-low voltage (meanwhile, the self refresh signal SR is at a logic-high voltage), the first input buffer 202 is turned off and the second input buffer 204 outputs the second signal S2 according to the input signal XCKE and the self refresh signal SR.

The multiplexer 206 is coupled to the first input buffer 202 and the second input buffer 206. The multiplexer 206 has a first input terminal for receiving the first signal S1, a second input terminal for receiving the second signal S2, a third input terminal for receiving the self refresh signal SR, and an output terminal for outputting the first signal S1 or the second signal S2. When the self refresh signal SR is at the logic-high voltage, the multiplexer 206 outputs the second signal S2 according to the self refresh signal SR; when the self refresh signal SR is at the logic-low voltage, the multiplexer 206 outputs the first signal S1 according to the self refresh signal SR. Therefore, when the self refresh signal SR is at the logic-low voltage and the input signal XCKE is at the logic-high voltage, the multiplexer 206 outputs the first signal S1 with the logic-high voltage according to the self refresh signal SR with the logic-low voltage. When the self refresh signal SR is at the logic-high voltage and the input signal XCKE is at the logic-low voltage (meanwhile, the first input buffer 202 is turned off), the multiplexer 206 outputs the second signal S2 with the logic-low voltage according to the self refresh signal SR with the logic-high voltage. But, the present invention is not limited to the above mentioned operation of the multiplexer 206. That is to say, as long as when the input signal XCKE is at the logic-high voltage, the multiplexer 206 outputs the first signal S1 with the logic-high voltage; when the input signal XCKE is at the logic-low voltage, the multiplexer 206 outputs the second signal S2 with the logic-low voltage.

Figure 3:
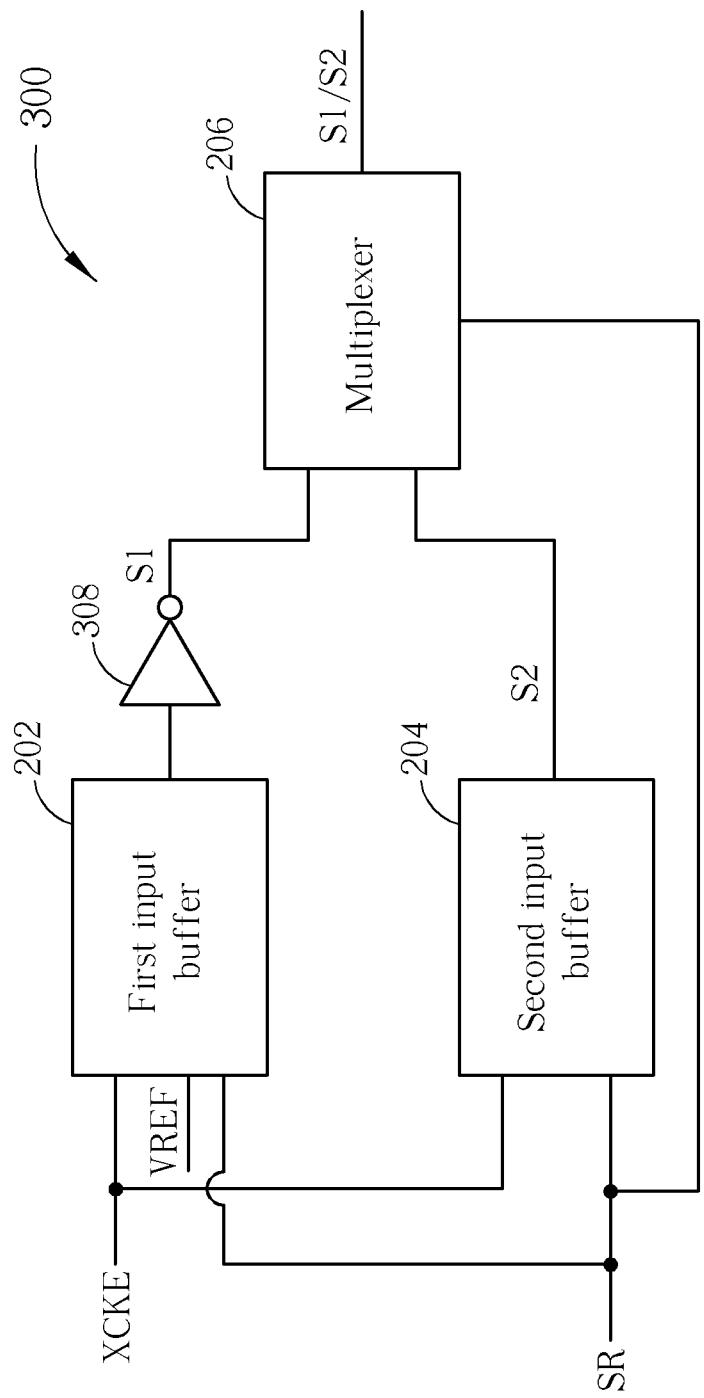
FIG. 3 is a diagram illustrating an input buffer system with a dual-input buffer switching function according to another embodiment.

Please refer to FIG. 3. FIG. 3 is a diagram illustrating an input buffer system 300 with a dual-input buffer switching function according to another embodiment. A difference between the input buffer system 300 and the input buffer system 200 is that the input buffer system 300 has a first inverter 308 coupled between the first input buffer 202 and the multiplexer 206. Therefore, when the input signal XCKE is at the logic-high voltage, the first input buffer 202 generates the first signal S1 through the first inverter 308, where the first signal S1 is also at the logic-high voltage. Further, subsequent operational principles of the input buffer system 300 are the same as those of the input buffer system 200, so further description thereof is omitted for simplicity.

Figure 4:
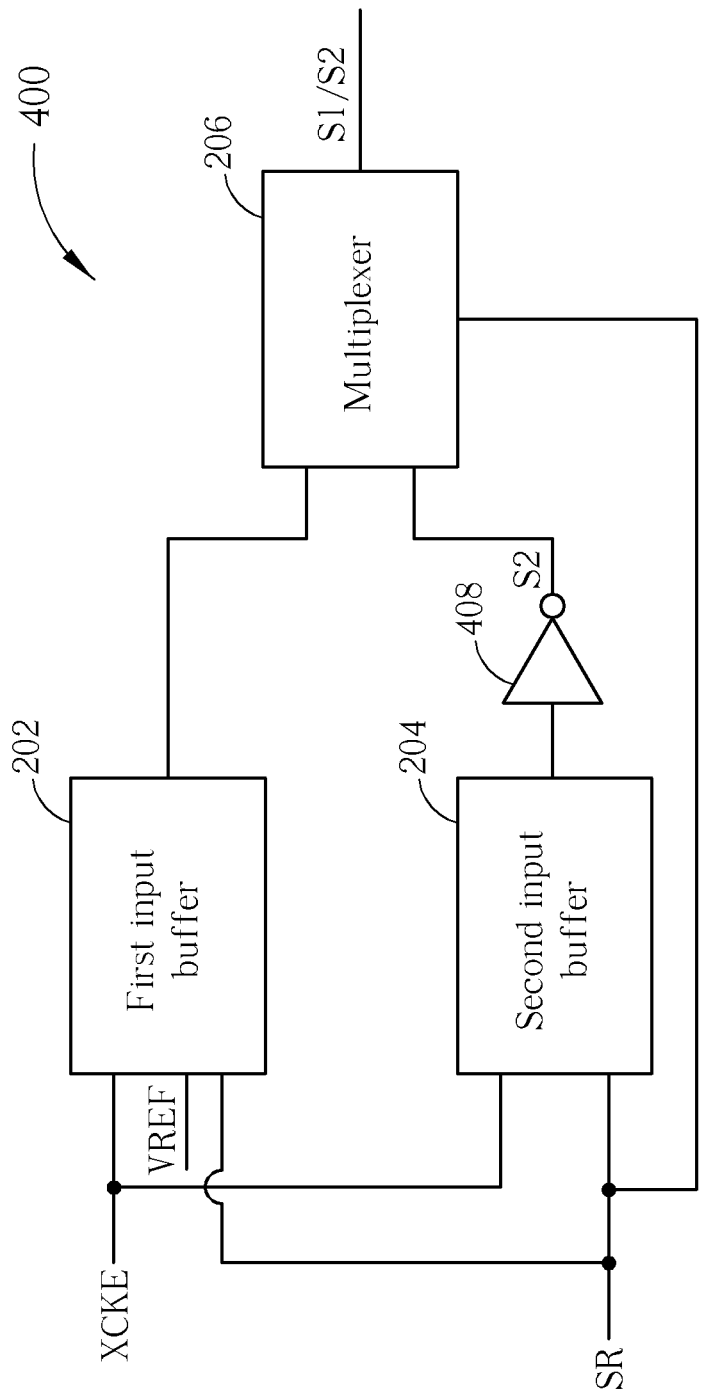
FIG. 4 is a diagram illustrating an input buffer system with a dual-input buffer switching function according to another embodiment.

Please refer to FIG. 4. FIG. 4 is a diagram illustrating an input buffer system 400 with a dual-input buffer switching function according to another embodiment. A difference between the input buffer system 400 and the input buffer system 200 is that the input buffer system 400 has a second inverter 408 coupled between the second input buffer 204 and the multiplexer 206. Therefore, when the input signal XCKE is at the logic-low voltage, the second input buffer 204 generates the second signal S2 through the second inverter 408, where the second signal S2 is also at the logic-low voltage. Further, subsequent operational principles of the input buffer system 400 are the same as those of the input buffer system 200, so further description thereof is omitted for simplicity.

Figure 5:
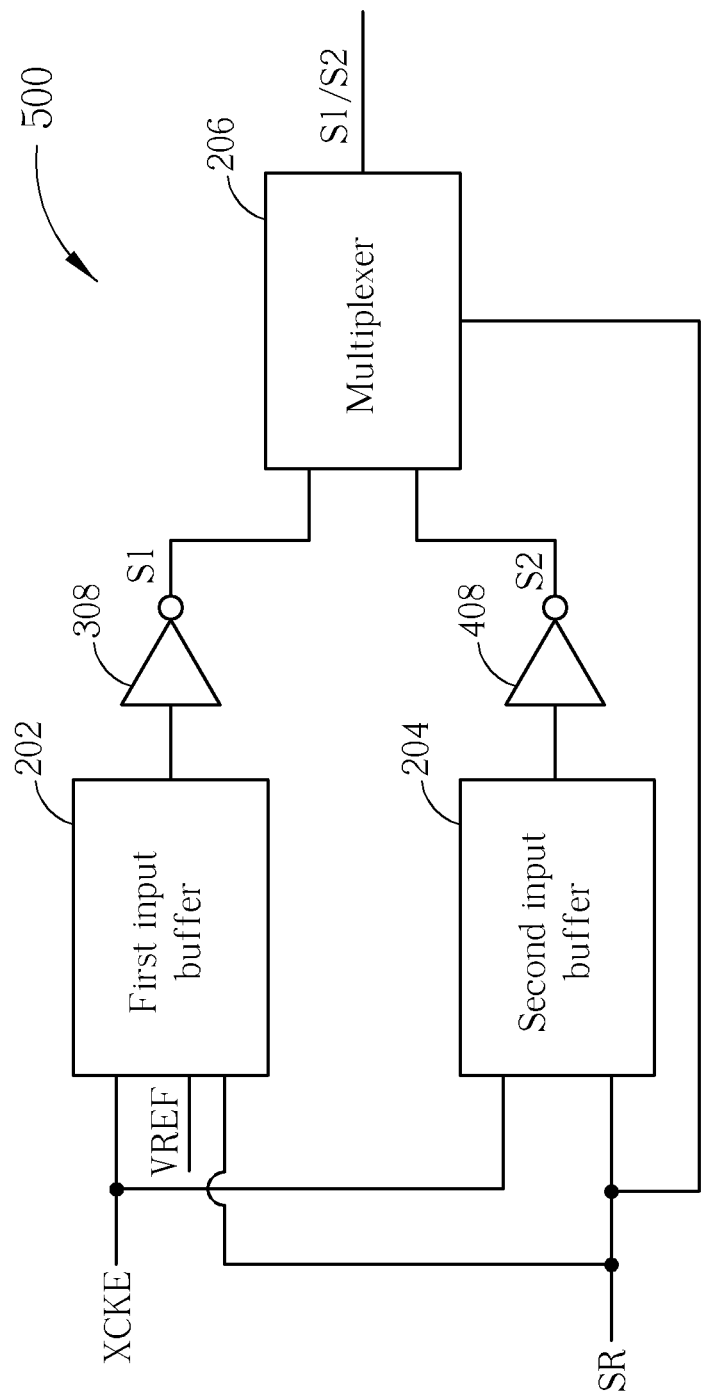
FIG. 5 is a diagram illustrating an input buffer system with a dual-input buffer switching function according to another embodiment.

Please refer to FIG. 5. FIG. 5 is a diagram illustrating an input buffer system 500 with a dual-input buffer switching function according to another embodiment. A difference between the input buffer system 500 and the input buffer system 300 is that the input buffer system 500 has a second inverter 408 coupled between the second input buffer 204 and the multiplexer 206. Therefore, when the input signal XCKE is at the logic-low voltage, the second input buffer 204 generates the second signal S2 through the second inverter 408, where the second signal S2 is also at the logic-low voltage. Further, subsequent operational principles of the input buffer system 500 are the same as those of the input buffer system 300, so further description thereof is omitted for simplicity.

Figure 6:
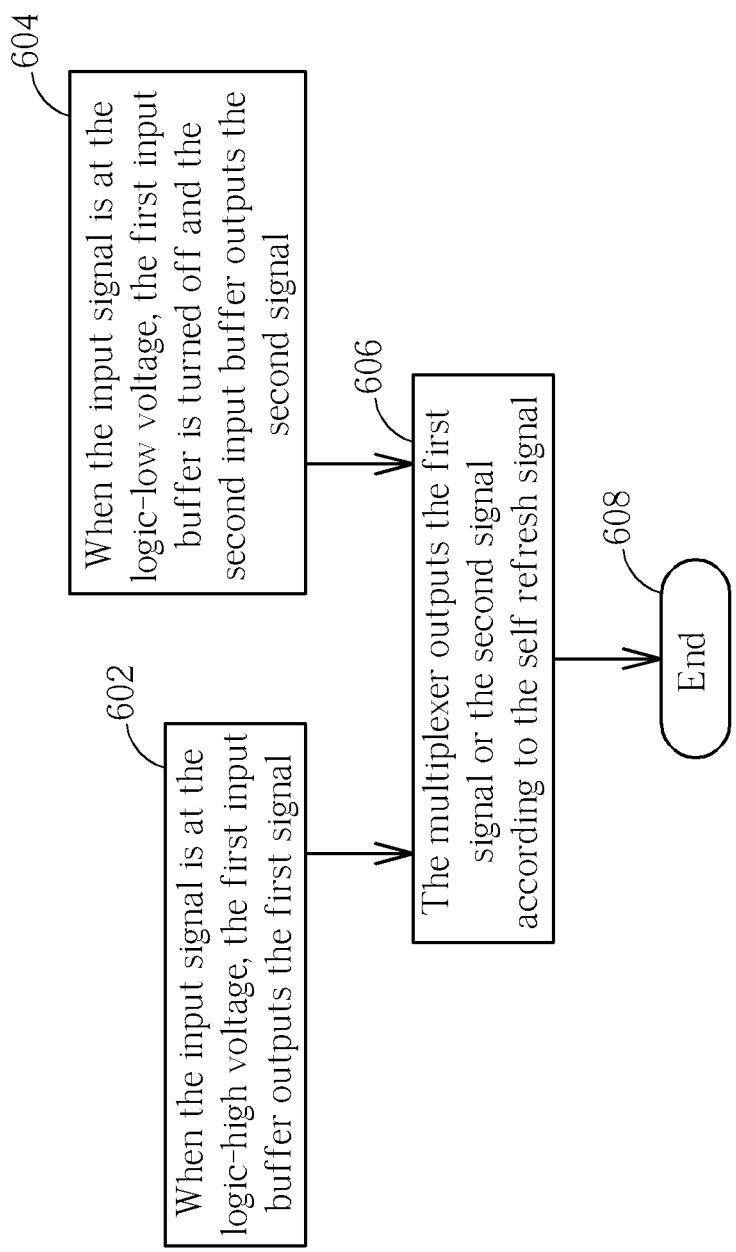
FIG. 6 is a flowchart illustrating a method of switching a dual-input buffer according to another embodiment.

Please refer to FIG. 6. FIG. 6 is a flowchart illustrating a method of switching a dual-input buffer according to another embodiment. The method in FIG. 6 uses the input buffer system 200 in FIG. 2 to illustrate the method. Detailed steps are as follows:

Step 602: When the input signal XCKE is at the logic-high voltage, the first input buffer 202 outputs the first signal S1; go to Step 606.

Step 604: When the input signal XCKE is at the logic-low voltage, the first input buffer 202 is turned off and the second input buffer 204 outputs the second signal S2; go to Step 606.

Step 606: The multiplexer 206 outputs the first signal S1 or the second signal S2 according to the self refresh signal SR.

Step 608: End.

In Step 606, the multiplexer 206 outputs the first signal S1 or the second signal S2 according to the self refresh signal SR. That is to say, as log as when the input signal XCKE is at the logic-high voltage, the multiplexer 206 outputs the first signal S1 with the logic-high voltage; when the input signal XCKE is at the logic-low voltage, the multiplexer 206 outputs the second signal S2 with the logic-low voltage.

Figure 7:
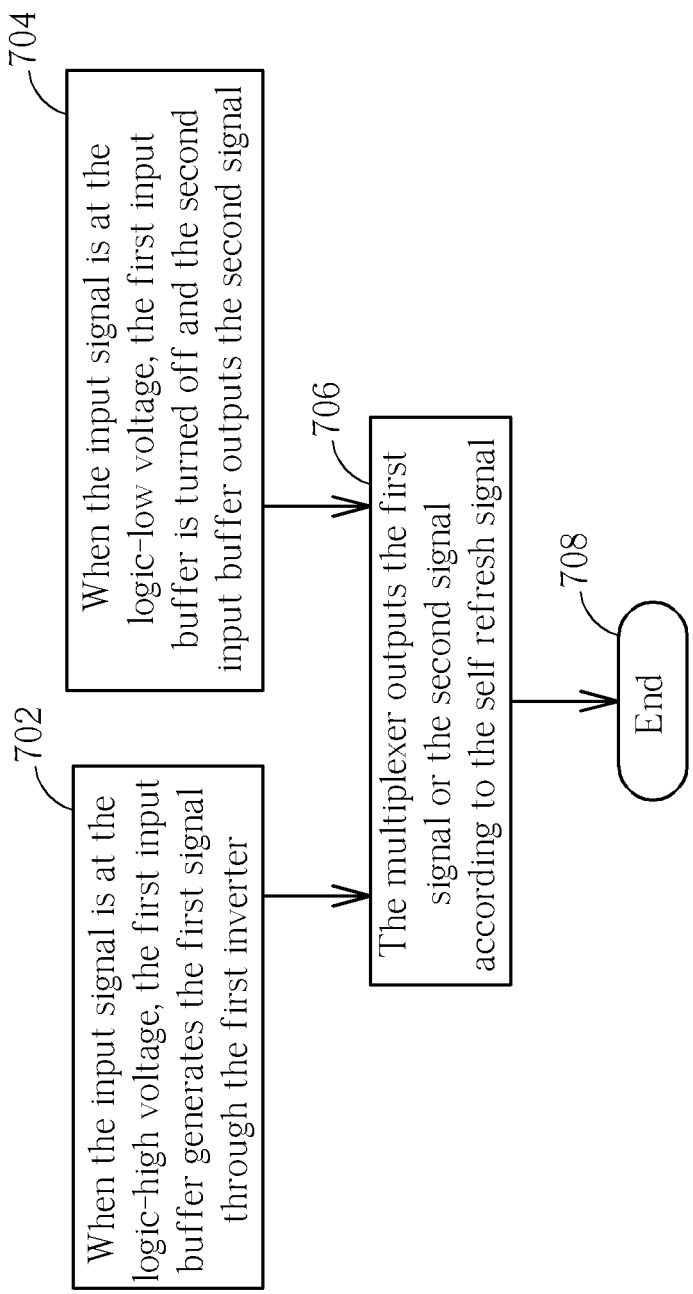
FIG. 7 is a flowchart illustrating a method of switching a dual-input buffer according to another embodiment.

Please refer to FIG. 7. FIG. 7 is a flowchart illustrating a method of switching a dual-input buffer according to another embodiment. The method in FIG. 7 uses the input buffer system 300 in FIG. 3 to illustrate the method. Detailed steps are as follows:

Step 702: When the input signal XCKE is at the logic-high voltage, the first input buffer 202 generates the first signal S1 through the first inverter 308; go to Step 706.

Step 704: When the input signal XCKE is at the logic-low voltage, the first input buffer 202 is turned off and the second input buffer 204 outputs the second signal S2; go to Step 706.

Step 706: The multiplexer 206 outputs the first signal S1 or the second signal S2 according to the self refresh signal SR.

Step 708: End.

A difference between the embodiment in FIG. 7 and the embodiment in FIG. 6 is that in Step 702, the first input buffer 202 generates the first signal S1 through the first inverter 308. Further, subsequent operational principles of the embodiment in FIG. 7 are the same as those of the embodiment in FIG. 6, so further description thereof is omitted for simplicity.

Figure 8:
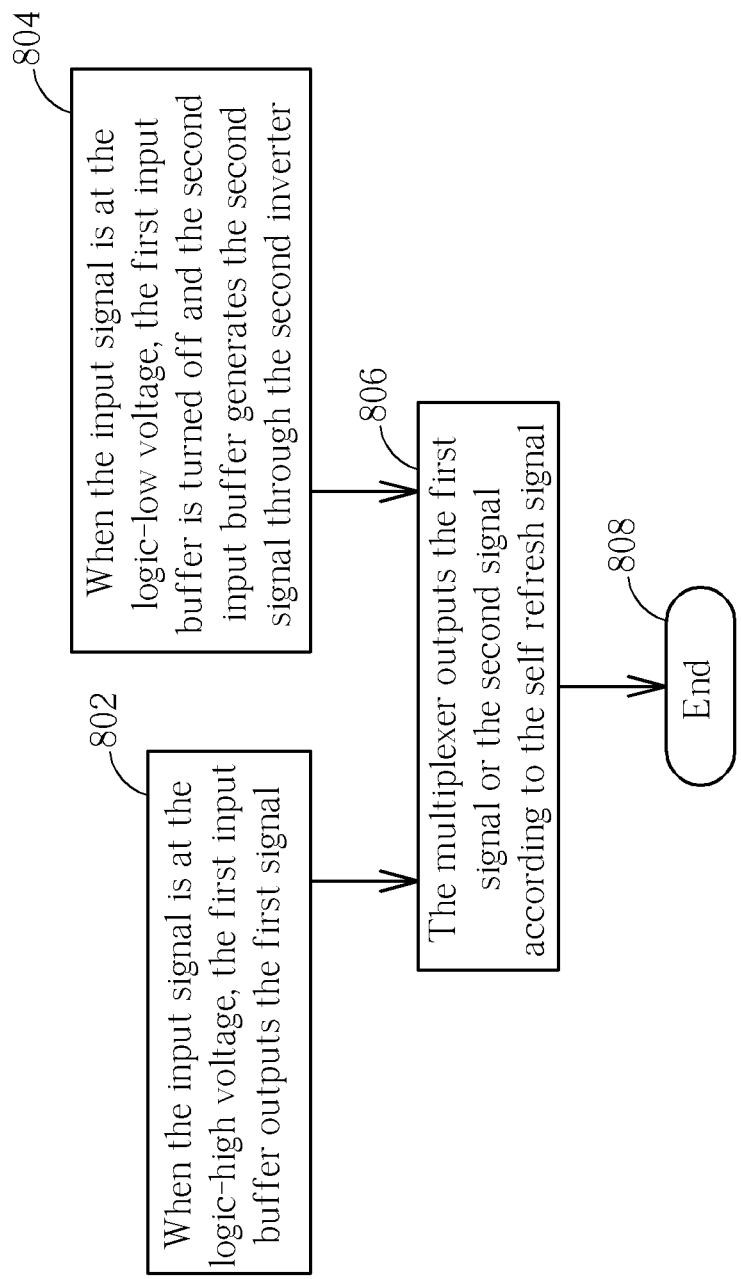
FIG. 8 is a flowchart illustrating a method of switching a dual-input buffer according to another embodiment.

Please refer to FIG. 8. FIG. 8 is a flowchart illustrating a method of switching a dual-input buffer according to another embodiment. The method in FIG. 8 uses the input buffer system 400 in FIG. 4 to illustrate the method. Detailed steps are as follows:

Step 802: When the input signal XCKE is at the logic-high voltage, the first input buffer 202 outputs the first signal S1; go to Step 806.

Step 804: When the input signal XCKE is at the logic-low voltage, the first input buffer 202 is turned off and the second input buffer 204 generates the second signal S2 through the second inverter 408; go to Step 806.

Step 806: The multiplexer 206 outputs the first signal S1 or the second signal S2 according to the self refresh signal SR.

Step 808: End.

A difference between the embodiment in FIG. 8 and the embodiment in FIG. 6 is that in Step 804, the second input buffer 204 generates the second signal S2 through the second inverter 408. Further, subsequent operational principles of the embodiment in FIG. 8 are the same as those of the embodiment in FIG. 6, so further description thereof is omitted for simplicity.

Figure 9:
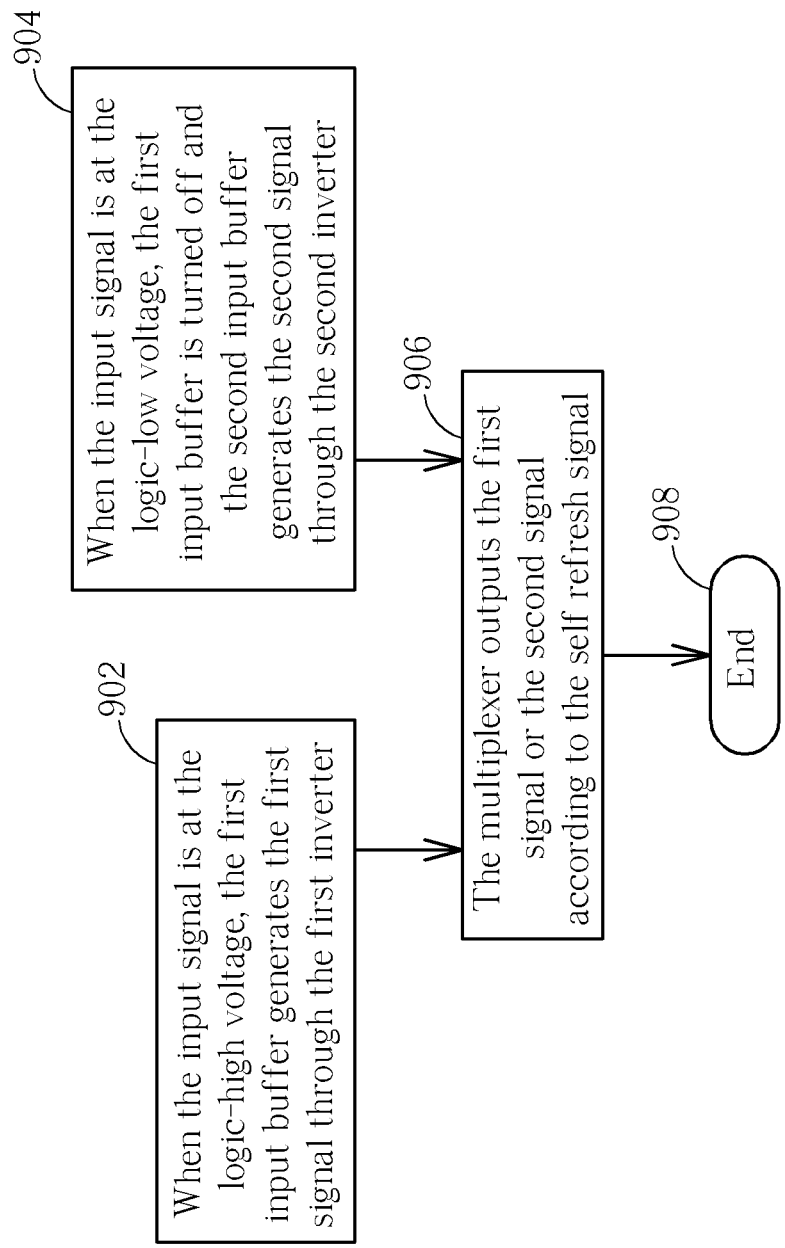
FIG. 9 is a flowchart illustrating a method of switching a dual-input buffer according to another embodiment.

Please refer to FIG. 9. FIG. 9 is a flowchart illustrating a method of switching a dual-input buffer according to another embodiment. The method in FIG. 9 uses the input buffer system 500 in FIG. 5 to illustrate the method. Detailed steps are as follows:

Step 902: When the input signal XCKE is at the logic-high voltage, the first input buffer 202 generates the first signal S1 through the first inverter 308; go to Step 906.

Step 904: When the input signal XCKE is at the logic-low voltage, the first input buffer 202 is turned off and the second input buffer 204 generates the second signal S2 through the second inverter 408; go to Step 906.

Step 906: The multiplexer 206 outputs the first signal S1 or the second signal S2 according to the self refresh signal SR.

Step 908: End.

A difference between the embodiment in FIG. 9 and the embodiment in FIG. 8 is that in Step 902, the first input buffer 202 generates the first signal S1 through the first inverter 308. Further, subsequent operational principles of the embodiment in FIG. 9 are the same as those of the embodiment in FIG. 8, so further description thereof is omitted for simplicity.

To sum up, the input buffer system with the dual-input buffer switching function and method thereof utilize the first input buffer to output the first signal with the logic-high voltage when the input signal is at the logic-high voltage, and the second input buffer to output the second signal with the logic-low voltage when the input signal is at the logic-low voltage. Then, the multiplexer outputs the first signal when the input signal is at the logic-high voltage, and outputs the second signal when the input signal is at the logic-low voltage. Therefore, time required by an output signal of the input buffer system being changed from the logic-high voltage to the logic-low voltage is the same as time required by the output signal being changed from the logic-low voltage to the logic-high voltage. Thus, when the input buffer system is applied to a self refresh function of a synchronous dynamic random access memory (SDRAM), setup time of the synchronous dynamic random access memory is correct after the synchronous dynamic random access memory enters the self refresh function.

Those skilled in the art will readily observe that numerous modifications and alterations of the device and method may be made while retaining the teachings of the invention.

What is claimed is:

1. An input buffer system with a dual-input buffer switching function, the input buffer system comprising:
   a first input buffer for receiving an input signal, a reference signal, and a self-refresh signal, and outputting a first signal according to the input signal, the reference signal, and the self-refresh signal, wherein the first input buffer is turned off according to the self-refresh signal when the input signal is at a logic-low voltage;
   a second input buffer for receiving the input signal and the self-refresh signal, and outputting a second signal according to the input signal and the self-refresh signal, wherein the second input buffer is turned off according to the self-refresh signal when the input signal is at a logic-high voltage; and
   a multiplexer coupled to the first input buffer and the second input buffer for outputting the first signal or the second signal according to the self-refresh signal.

2. The input buffer system of claim 1, wherein the first input buffer is a comparator.

3. The input buffer system of claim 1, wherein the second input buffer is a NAND gate.

4. The input buffer system of claim 1, further comprising:
   a first inverter coupled between the first input buffer and the multiplexer.

5. The input buffer system of claim 1, further comprising:
   a second inverter coupled between the second input buffer and the multiplexer.

6. A method of switching a dual-input buffer, the method comprising:
   inputting an input signal, a reference signal, and a self-refresh signal to a first input buffer, wherein the first input buffer is turned off according to the self-refresh signal when the input signal is at a logic-low voltage;
   inputting the input signal, and the self-refresh signal to a second input buffer, wherein the second input buffer is turned off according to the self-refresh signal when the input signal is at a logic-high voltage;
   the first input buffer outputting a first signal according to the input signal, the reference signal, and the self-refresh signal;
   the second input buffer outputting a second signal according to the input signal and the self-refresh signal; and
   a multiplexer outputting the first signal or the second signal according to the self-refresh signal.

7. The method of claim 6, wherein the first input buffer generates the first signal through a first inverter.

8. The method of claim 7, wherein the second input buffer generates the second signal through a second inverter.

9. The method of claim 6, wherein the second input buffer generates the second signal through a second inverter.

* * * * *